United States Patent
Snell

(10) Patent No.: US 8,051,402 B2
(45) Date of Patent: Nov. 1, 2011

(54) METHOD AND APPARATUS FOR IMPLEMENTING COMMUNICATION BETWEEN A SOFTWARE SIDE AND A HARDWARE SIDE OF A TEST BENCH IN A TRANSACTION-BASED ACCELERATION VERIFICATION SYSTEM

(75) Inventor: Robert Clayton Snell, Fitzroy Harbour (CA)

(73) Assignee: Cadence Design Systems, Inc., San Jose, CA (US)

( * ) Notice: Subject to any disclaimer, the term of this patent is extended or adjusted under 35 U.S.C. 154(b) by 576 days.

(21) Appl. No.: 11/861,952

(22) Filed: Sep. 26, 2007

(65) Prior Publication Data

US 2009/0083683 A1    Mar. 26, 2009

(51) Int. Cl.
*G06F 17/50* (2006.01)
(52) U.S. Cl. ........................................ 716/136; 716/106
(58) Field of Classification Search ................... None
See application file for complete search history.

(56) References Cited

U.S. PATENT DOCUMENTS

| | | | |
|---|---|---|---|
| 7,003,422 B2 * | 2/2006 | Bauer et al. | 702/120 |
| 7,257,802 B2 * | 8/2007 | Daw et al. | 716/18 |
| 7,260,798 B2 * | 8/2007 | Gupta et al. | 716/5 |
| 7,440,885 B2 * | 10/2008 | Garcia et al. | 703/25 |

OTHER PUBLICATIONS

Accellera, "Standard Co-Emulation Modeling Interface (SCE-MI) Reference Manual," Version 1.1.0, Jan. 13, 2005, 134 pages.*
Kim et al., "Reducing Transaction-Level Modeling Effort while Retaiming Low Communication Overhead for HW/SW Co-Emulation System," Int'l Symposium on VLSI Design, Automation and Test, Apr. 25-27, 2007, pp. 1-4.*

* cited by examiner

*Primary Examiner* — Leigh Garbowski
(74) *Attorney, Agent, or Firm* — Holland & Knight LLP; Brian J. Colandreo, Esq.; Mark H. Whittenberger, Esq.

(57) ABSTRACT

Method and apparatus for implementing communication between a software side and a hardware side of a test bench in a transaction-based acceleration verification system are described. In one example, transactors and communication channels are identified in a hierarchy of the test bench. Software side endpoints of the communication channels are automatically bound to hardware side endpoints of the communication channels during verification based on naming attributes of the transactors and communication channels with respect to the software side and the hardware side of the test bench.

20 Claims, 3 Drawing Sheets

METHOD AND APPARATUS FOR IMPLEMENTING COMMUNICATION BETWEEN A SOFTWARE SIDE AND A HARDWARE SIDE OF A TEST BENCH IN A TRANSACTION-BASED ACCELERATION VERIFICATION SYSTEM

BACKGROUND OF THE INVENTION

1. Field of the Invention

Embodiments of the invention generally relate to simulation of logic designs and, more specifically, to a method and apparatus for implementing communication between a software side and a hardware side of a test bench in a transaction-based acceleration verification system.

2. Description of the Related Art

In electronic design automation (EDA), functional verification is the task of verifying that a logic design conforms to its specification. Logic simulation is the process of simulating a logic design before the logic design manufactured as integrated circuits (ICs). In software simulation, a description of the logic design is simulated on computers or workstations. Logic designs may be described using various languages, such as hardware description languages (HDLs) or other more abstract languages (e.g., synthesizable SystemC). In software simulation, engineers write a test-bench program to functionally verify the logic design by providing meaningful scenarios to check that, given certain input stimuli, the design performs to specification. A test-bench may be written using various languages, including lower-level languages, such as very high speed integrated circuit HDL (VHDL), Verilog, and the like, as well as more abstract languages, such as C/C++, SystemC, SystemVerilog, and the like. Higher-level languages, such as SystemC, enable engineers to write more abstract test-bench models for simulation, such as transaction-level models (TLMs), as opposed to lower-level register transfer level (RTL) models. Pure software simulation, however, decreases in performance as the logic design becomes larger and more complex.

Simulation acceleration addresses the performance shortcomings of pure software simulation. In simulation acceleration, the logic design is mapped into a hardware accelerator to provide a design under verification (DUV), which allows the design to run much faster than on a general-purpose computer or workstation. The test-bench continues to run using a software simulator on a computer or workstation. A communication channel connects the software simulator and the hardware accelerator to exchange data between the test-bench and design. In signal-based acceleration, actual signal data is exchanged between the test-bench and design. Signal-based acceleration is also referred to as lock-step acceleration, as the software simulator and the hardware accelerator are normally locked together cycle-by-cycle. In simulation acceleration, verification of the logic design can only run as fast as the slowest element in the chain, which is typically the software simulator. With a very efficient test-bench, such as a TLM-based test-bench, the communication channel between the software simulator and the hardware accelerator may become the bottleneck.

Transaction-based acceleration (TBA) is a methodology that overcomes some of the performance limitations of signal-based acceleration and, in some instances, can achieve performance close to in-circuit emulation. In the TBA methodology, a TLM-based test-bench runs on a software simulator at an un-timed level of abstraction and communicates with a DUV on a hardware accelerator through an abstraction bridge. By "un-timed" it is meant that the test-bench has no notion of a clock, but rather exchanges data with the DUV in the form of messages (transactions). The abstraction bridge provides an interface between the un-timed test-bench model and the RTL-based DUV in the hardware accelerator. The abstraction bridge facilitates the exchange of messages between the software model (test bench running on the simulator) and the hardware model (DUV running on the hardware accelerator) using transactors. A transactor may decompose an un-timed message from the software model to a series of cycle-accurate clocked events for the hardware model. Conversely, a transactor may compose a series of clocked events from the hardware model into a single message for the software model.

In particular, a transactor includes three partitions: a software side, a hardware side, and one or more communication channels. The software side is the un-accelerated partition that runs on the software simulator with the test-bench. The hardware side is the accelerated partition that runs on the hardware accelerator with the DUV. It is necessary that a transactor operate as one logical unit, which requires the software and hardware partitions to communicate with each other. This communication is performed using available communication channels.

In a test-bench environment, a logical transactor is represented as an instance of the software side partition and an instance of the hardware side partition. The required endpoints of the communication channel(s) are embedded into the physical partitions and are connected via a binding process. The location of each physical partition of a transactor is dependent upon the needs of the test-bench. Therefore, the actual location of the software side partition, within the test-bench hierarchy, differs from the location of the hardware side partition. To allow the two physical partitions to operate as a single logical unit, the software side partition must have knowledge of the location of the hardware side so that the endpoints of the communication channel(s) can be bound during verification. Once the endpoints are bound, the communication channel(s) are formed. The current approach to provide the software side partition with the location of the hardware side partition requires that the user manually provide the location of the hardware side partition. This computed location takes the form of a hierarchical path from a designated reference point. The hierarchical path is then annotated to the software side partition by the user.

There are several disadvantages to manually annotate the software side partition with the location of the hardware side partition. First, the hierarchical path can be derived or entered incorrectly by the user, resulting in errors during verification. Different tests that require changes to the test-bench architecture result in revised hierarchical paths, requiring the user to re-annotate the software side partition. In some cases, test-benches are not portable between simulation acceleration platforms due to differing reference points for the hierarchical path. Finally, the need to manually annotate the software side partition increases the workload of the user. Therefore, there exists a need in the art for automatic binding of transactor communication channel endpoints in transaction-based acceleration platforms for functional verification.

SUMMARY OF THE INVENTION

One aspect of the invention relates to implementing communication between a software side and a hardware side of a test bench in a transaction-based acceleration verification system. Transactors and communication channels are identified in a hierarchy of the test bench. Software side endpoints of the communication channels are automatically bound to hardware side endpoints of the communication channels during verification based on naming attributes of the transactors and communication channels with respect to the software side and the hardware side of the test bench.

Another aspect of the invention relates to a transaction-based acceleration verification system. A hardware accelerator is configured to simulate a device under verification (DUV) and a hardware side of a test bench. A workstation is coupled to the hardware accelerator and includes a simulator and a binding infrastructure. The simulator is configured to simulate a software side of the test bench. The binding infrastructure is configured to identify transactors and communication channels in a hierarchy of the test bench, and bind, automatically during verification, software side endpoints of the communication channels to hardware side endpoints of the communication channels based on naming attributes of the transactors and communication channels with respect to the software side and the hardware side of the test bench.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
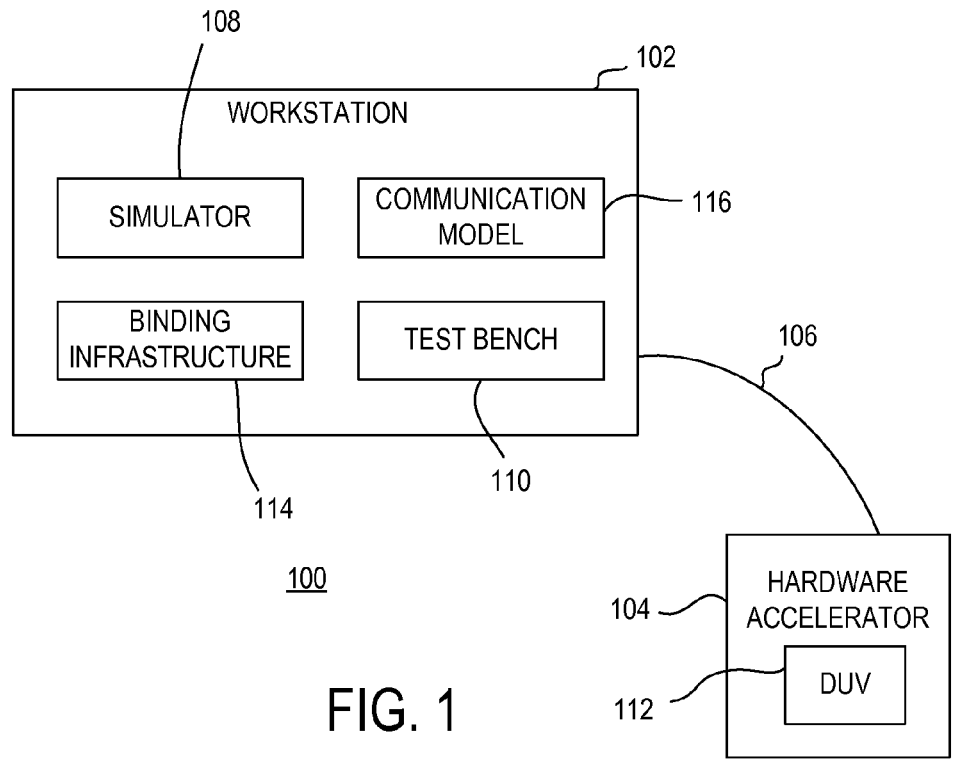
FIG. 1 is a block diagram depicting an exemplary embodiment of a logic design verification system in accordance with one or more aspects of the invention.

FIG. 1 is a block diagram depicting an exemplary embodiment of a logic design verification system 100 in accordance with one or more aspects of the invention. The system 100 includes a workstation 102 coupled to a hardware accelerator 104 via a communication link 106. The workstation 102 may comprise any type of general-purpose or specific-purpose computer. An exemplary computer is shown below in FIG. 5. The hardware accelerator 104 may comprise any type of acceleration or acceleration/emulation platform capable of transaction-based acceleration (TBA). For example, the hardware accelerator 104 may comprise a PALLADIUM series accelerator/emulator commercially available from Cadence Design Systems, Inc. of San Jose, Calif. The communication link 106 comprises any type of high-speed bus for the transfer of signals between the workstation 102 and the hardware accelerator 104.

The hardware accelerator 104 is configured with a design under verification (DUV) 112. The workstation 102 is loaded with a test bench 110. The test bench 110 is configured to perform tests on the DUV 112 for functionally verifying the logic design of the DUV 112. The test bench 110 defines a verification environment having one or more software models ("software portion") configured to communicate through an abstraction bridge with one or more hardware models ("hardware portion"). The software model(s) of the software portion are written using a programming language, such as C/C++, SystemC, SystemVerilog, and the like, and are compiled for execution by a simulator 108. The software model(s) may comprise various test algorithms and routines for functional verification. The hardware model(s) of the hardware portion are specified using a synthesizable language (e.g., an HDL or synthesizable SystemC) and are compiled into a form suitable for execution by the hardware accelerator 104. The hardware portion of the test bench 110 provides a hardware interface to the DUV 112. The abstraction bridge provides an interface between the software portion and the hardware portion of the test bench 110. In particular, the abstraction bridge includes one or more logical transactors as defined by a communication model 116. As described above, transactors facilitate the exchange of messages or transactions between the software and hardware portions of the test bench 110 and allow the simulator 108 to drive the DUV 112 in the hardware accelerator 104.

Figure 2:
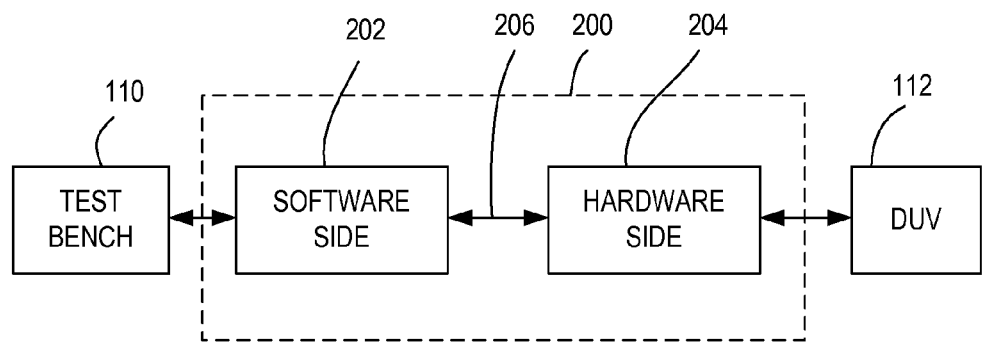
FIG. 2 is a block diagram depicting an exemplary embodiment of a logical transactor in accordance with one or more aspects of the invention.

FIG. 2 is a block diagram depicting an exemplary embodiment of a logical transactor 200 in accordance with one or more aspects of the invention. The logical transactor 200 includes a software side 202, a hardware side 204, and one or more communication channels 206 (e.g., a single communication channel is shown by example). The software side 202 runs on the workstation 102 during a verification session (e.g., is executed by the simulator 108) and interfaces with the software portion of the test bench 110. The hardware side 204 runs on the hardware accelerator 104 during a verification session and interfaces with the hardware portion of the test bench 110 and ultimately the DUV 112. The communication channel 206 allows the software side 202 to communicate with the hardware side 204.

With reference to FIGS. 1 and 2, the location of the software side 202 within the hierarchy of the test bench 110 differs from the location of the hardware side 204. To allow the software side 202 and the hardware side 204 to operate as a single logical unit to implement the logical transactor 200, the software side 202 must have knowledge of the location of the hardware side 204 in the hierarchy of the test bench 110. Such knowledge allows the endpoints of the communication channel 206 to be bound. The binding infrastructure 114 provides an automated mechanism for binding endpoints of the communication channels in logical transactors. The user is not required to specify the location of the hardware side 204 within the hierarchy of the test bench 110. This eliminates the user requirement of annotating the information to the software side 202, making transactors easier to use. Embodiments of the automated binding process are described below.

In some embodiments, the communication model 116 provides a registration mechanism in the architecture of the transactor. The registration mechanism allows the binding infrastructure 114 to gather the location of any transactor in the hierarchy of the test bench 110. The transactor registration mechanism may take the form of a function or other type of programming construct that is used by the author of a transactor for the purposes of registering the transactor. The communication model 116 also provides a registration mechanism in the architecture of the communication channel. This registration mechanism allows the binding infrastructure 114 to gather the location of any communication channel used within a transactor. This registration mechanism also allows the binding infrastructure 114 to recognize which transactors enclose any particular communication channel. The communication channel registration mechanism may take the form of a function or other type of programming construct that is used during implementation of the communication channel. It is not necessary that the registration mechanism be inserted into the architectures of the transactor and communication channel. In some embodiments, the communication model 116 may provide an external registration mechanism.

As described below with respect to the exemplary test bench hierarchy shown in FIG. 4, transactors and communication channels include definitions and occurrences. The communication model 116 provides rules for the definition and occurrence of logical transactors. The communication model 116 requires that the occurrence name of the software side 202 be the same as the occurrence name of the hardware side 204. Likewise, the occurrence and definition names for the communication channel endpoints are the same between the software side 202 and the hardware side 204.

Figure 3:
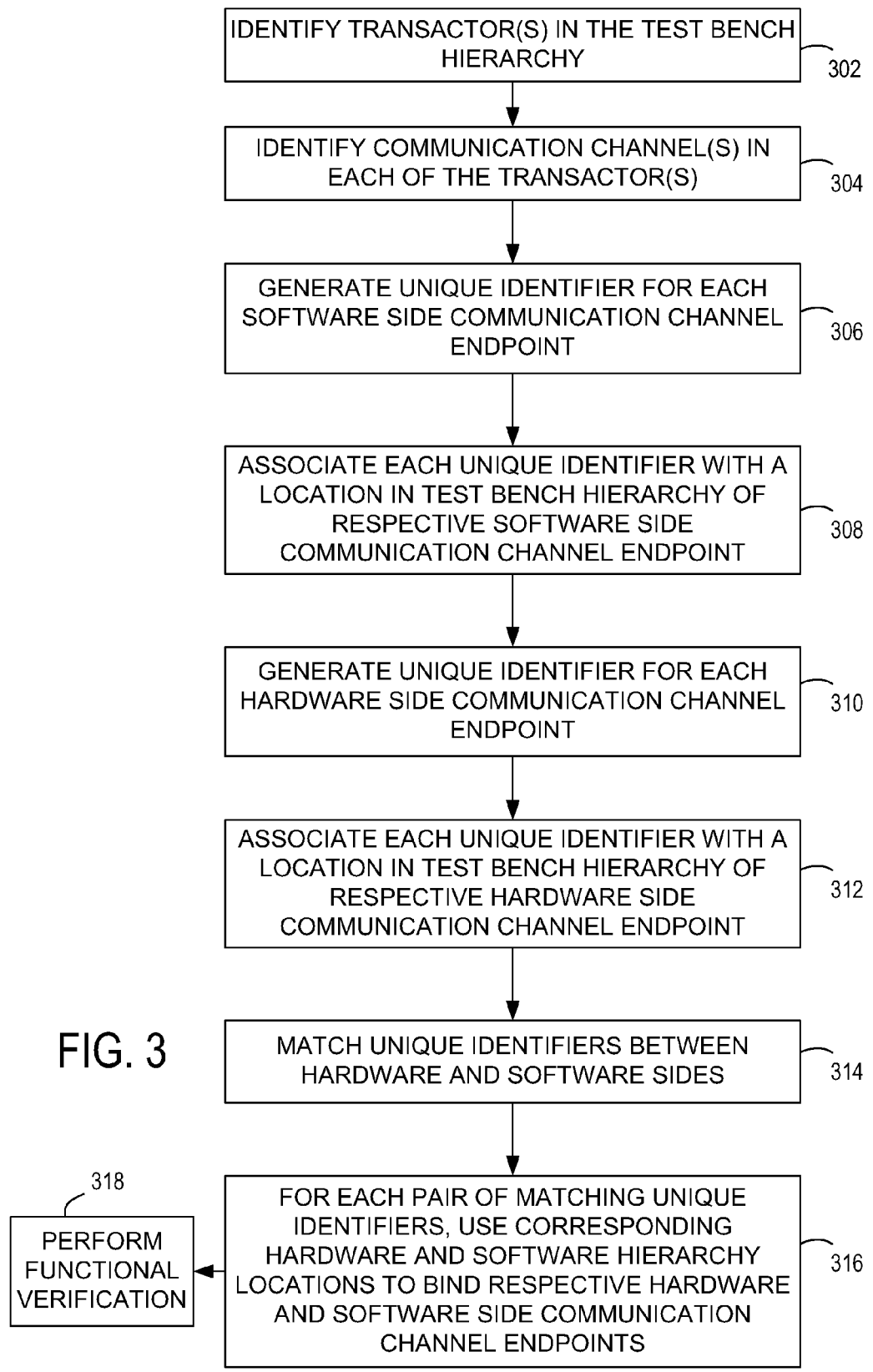
FIG. 3 is a flow diagram depicting an exemplary embodiment of a method of binding transactor communication channel endpoints in accordance with one or more aspects of the invention.

FIG. 3 is a flow diagram depicting an exemplary embodiment of a method 300 of binding transactor communication channel endpoints in accordance with one or more aspects of the invention. The method 300 may be performed by the binding infrastructure 114. The method 300 begins at block 302, where one or more transactors in the test bench hierarchy are identified. At block 304, one or more communication channels are identified in each of the transactor(s). Identification of the transactor(s) and corresponding communication channel endpoint(s) is facilitated by the respective registration mechanisms provided by the communication model 116.

At block 306, a unique identifier is generated for each software side communication channel endpoint. Each unique identifier is formed from a combination of name attributes associated with its respective software side communication channel endpoint. In some embodiments, each unique identifier is formed from a combination of a transactor definition name, a transactor occurrence name, a communication channel definition name, and a communication channel occurrence name related to its respective software side communication channel endpoint. In some embodiments, a vender identifier is used in combination with the above-identified name attributes. At block 308, each unique identifier is associated with a location in the test bench hierarchy of the respective software side communication channel endpoint it identifies. A location in the test bench hierarchy may be represented by a character string that defines a path in the hierarchy. Examples of such paths are described below.

At block 310, a unique identifier is generated for each hardware side communication channel endpoint. Each unique identifier is formed from a combination of name attributes associated with its respective hardware side communication channel endpoint. In some embodiments, each unique identifier is formed from a combination of a transactor definition name, a transactor occurrence name, a communication channel definition name, and a communication channel occurrence name related to its respective hardware side communication channel endpoint. In some embodiments, a vender identifier is used in combination with the above-identified name attributes. At block 312, each unique identifier is associated with a location in the test bench hierarchy of the respective hardware side communication channel endpoint it identifies.

At block 314, the unique identifiers for the software side communication channel endpoints are matched with the unique identifiers for the hardware side communication channel endpoints. At block 316, for each pair of matching unique identifiers, the corresponding hardware and software side hierarchy locations are used to bind the respective hardware and software side communication channel endpoints. At step 318, the test bench is used to perform functional verification tests of the DUV.

Figure 4:
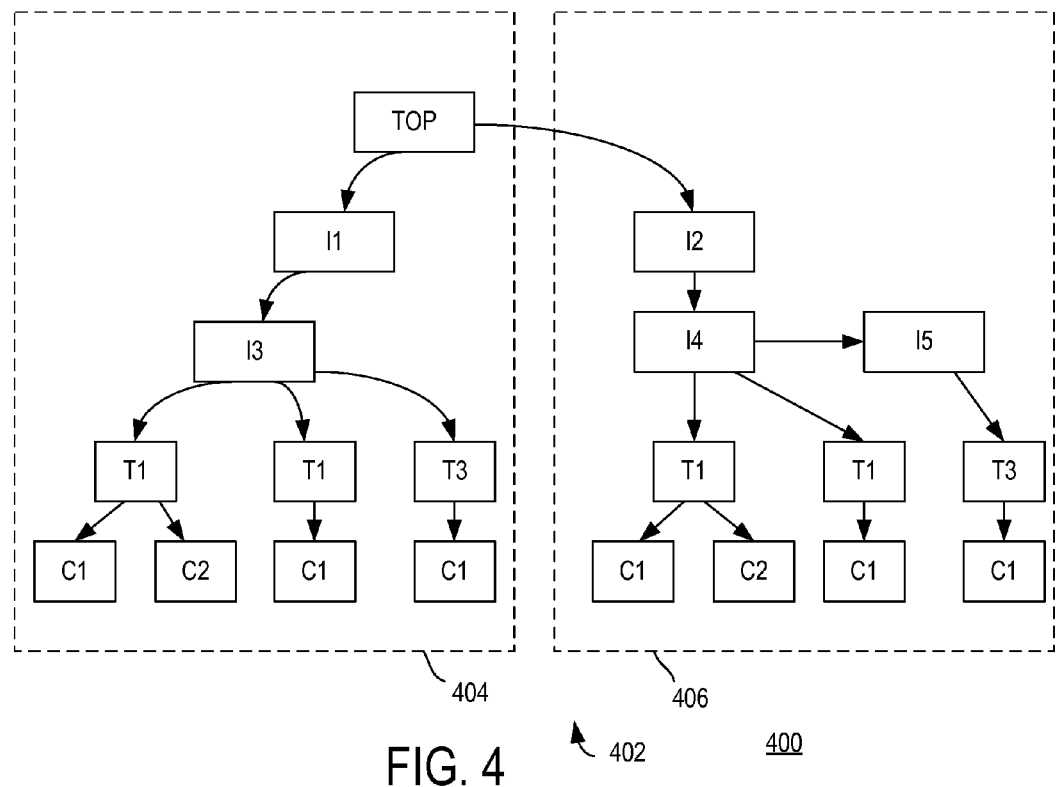
FIG. 4 is a block diagram depicting an exemplary embodiment of a test bench hierarchy in accordance with one or more aspects of the invention.

FIG. 4 is a block diagram depicting an exemplary embodiment of a test bench hierarchy 400 in accordance with one or more aspects of the invention. The test bench hierarchy 400 defines a verification environment 402 having a software side 404 and a hardware side 406. In FIG. 4, each box represents an instance of functionality (e.g., a SystemC SC_MODULE, Verilog module, etc.). Connecting arrows illustrate the hierarchy of the test bench. The top-most levels are at the top of the diagram and the lowest levels are at the bottom. The software side 404 is simulated on the workstation, whereas the hardware side 406 is simulated on the hardware accelerator.

In the present example, the software side 404 includes five levels of hierarchy having a module designated as top. The top module includes a module designated as I1. The I1 module includes a module designated as I3. The I3 module includes three occurrences of transactors, designated T1, T2, and T3. In the present example, the transactor occurrences T1, T2, and T3 have definition names of XA, XB, and XC, respectively. The transactor occurrence T1 includes two occurrences of communication channels, designated C1 and C2. The transactor occurrence T2 includes an occurrence of a communication channel designated C1. The transactor T3 includes an occurrence of a communication channel designated C1. The definition names of the communication channels on the software side 404 are: C1 of T1 is DP; C2 of T1 is SP; C1 of T2 is SP; and C1 of T3 is DP.

The hardware side 406 includes four levels of hierarchy under the top module. The top module includes a module designated as I2. The I2 module includes a module designated as I4. The I4 module includes a module designated as I5, as well as occurrences of transactors, designated T1 and T2. The I5 module includes an occurrence of a transactor designated T3. The transactor occurrence T1 includes two occurrences of communication channels, designated C1 and C2. The transactor occurrence T2 includes an occurrence of a communication channel designated C1. The transactor T3 includes an occurrence of a communication channel designated C1. Note that the occurrence and definition names of the transactors and communication channels in the software and hardware sides 404 and 406 match.

The method 300 may be understood with respect to the exemplary test bench hierarchy 400 shown in FIG. 4. Table 1 illustrates the state of the method 300 after registration of the transactors and communication channel endpoints on the software side 404 after identification (e.g., registration). Table 2 illustrates the state of the method 300 after registration of the transactors and communication channel endpoints on the hardware side 406 after identification (e.g., registration).

TABLE 1

| ID | Software Side Path |
|---|---|
| XC_T3 | Top.I1.I3.T3 |
| SP_C1 | Top.I1.I3.T3.C1 |
| XA_T1 | Top.I1.I3.T1 |
| DP_C1 | Top.I1.I3.T1.C1 |
| SP_C2 | Top.I1.I3.T1.C2 |
| XB_T2 | Top.I1.I3.T2 |
| DP_C1 | Top.I1.I3.T2.C1 |

TABLE 2

| ID | Hardware Side Path |
| --- | --- |
| XC_T3 | Top.I2.I4.I5.T3 |
| SP_C1 | Top.I2.I4.I5.T3.C1 |
| XA_T1 | Top.I2.I4.T1 |
| DP_C1 | Top.I2.I4.T1.C1 |
| SP_C2 | Top.I2.I4.T1.C2 |
| XB_T2 | Top.I2.I4.T2 |
| DP_C1 | Top.I2.I4.T2.C1 |

Based on the registration, a unique identifier is then formed for each software side communication channel endpoint (block 306) and is associated with the corresponding path (block 308). In the present example, the unique identifiers are generated using a combination of vender ID, transactor definition name, transactor occurrence name, communication channel definition name, and communication channel occurrence name. For example, the unique ID for the communication channel C1 of T1 on the software side 404 may be: cdn_XA_T1_DP_C1. The prefix "cdn" represents a vendor ID, XA is the definition of the transactor, T1 is the occurrence name of the transactor, DP is the definition name of the communication channel, and C1 is the occurrence name of the communication channel. This is illustrated in Table 3.

TABLE 3

| Communication Channel Unique ID | Software Side Path |
| --- | --- |
| cdn_XA_T1_DP_C1 | Top.I1.I3.T1.C1 |
| cdn_XA_T1_SP_C2 | Top.I1.I3.T1.C2 |
| cdn_XB_T2_DP_C1 | Top.I1.I3.T2.C1 |
| cdn_XC_T3_SP_C1 | Top.I1.I3.T3.C1 |

Based on the registration, a unique identifier is then formed for each hardware side communication channel endpoint (block 310) and is associated with the corresponding path (block 312). In the present example, the unique identifiers are generated using a combination of vender ID, transactor definition name, transactor occurrence name, communication channel definition name, and communication channel occurrence name. For example, the unique ID for the communication channel C1 of T1 on the hardware side 406 may be: cdn_XA_T1_DP_C1. The prefix "cdn" represents a vendor ID, XA is the definition of the transactor, T1 is the occurrence name of the transactor, DP is the definition name of the communication channel, and C1 is the occurrence name of the communication channel. This is illustrated in Table 4.

TABLE 4

| Communication Channel Unique ID | Hardware Side Path |
| --- | --- |
| cdn_XA_T1_DP_C1 | Top.I2.I4.T1.C1 |
| cdn_XA_T1_SP_C2 | Top.I2.I4.T1.C2 |
| cdn_XB_T2_DP_C1 | Top.I2.I4.T2.C1 |
| cdn_XC_T3_SP_C1 | Top.I2.I4.I5.T3.C1 |

The communication channel unique IDs are then matched between the hardware and software sides (block 314) and the corresponding paths for the software and hardware sides are matched (block 316). This is illustrated in Table 5.

TABLE 5

| Communication Channel Unique ID | Hardware Side Path | Software Side Path |
| --- | --- | --- |
| cdn_XA_T1_DP_C1 | Top.I2.I4.T1.C1 | Top.I1.I3.T1.C1 |
| cdn_XA_T1_SP_C2 | Top.I2.I4.T1.C2 | Top.I1.I3.T1.C2 |
| cdn_XB_T2_DP_C1 | Top.I2.I4.T2.C1 | Top.I1.I3.T2.C1 |
| cdn_XC_T3_SP_C1 | Top.I2.I4.I5.T3.C1 | Top.I1.I3.T3.C1 |

The resulting hardware and software side paths for each communication channel ID can then be used to bind the endpoints and implement the logical transactors. In this manner, transactor communication channel endpoints are bound automatically without manual intervention by the user. This eliminates a potential source of error in that the user is no longer required to annotate the software side with paths to the hardware side. Moreover, if the hierarchy of the test bench changes for different tests, no change is required with respect to channel binding. The channel endpoints and transactors will be newly registered and processed automatically as described above to facilitate the new bindings.

Figure 5:
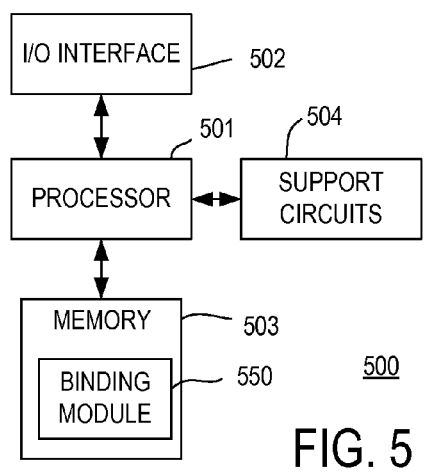
FIG. 5 is a block diagram depicting an exemplary embodiment of a computer system in accordance with one or more aspects of the invention.

FIG. 5 is a block diagram depicting an exemplary embodiment of a computer system 500 in accordance with one or more aspects of the invention. The computer system 500 may be used to implement the workstation 102. The computer system 500 includes a processor 501, a memory 503, various support circuits 504, and an I/O interface 502. The processor 501 may include one or more microprocessors known in the art. The support circuits 504 for the processor 501 include conventional cache, power supplies, clock circuits, data registers, I/O interfaces, and the like. The I/O interface 502 may be directly coupled to the memory 503 or coupled through the processor 501. The I/O interface 502 may also be configured for communication with the hardware accelerator 104.

The memory 503 stores processor-executable instructions and/or data that may be executed by and/or used by the processor 501. These processor-executable instructions may comprise hardware, firmware, software, and the like, or some combination thereof. A module having processor-executable instructions that are stored in the memory 503 may include an automated binding module 550. The automated binding module 550 is configured to perform the functions of the binding infrastructure 114 and the method 300 described above. The memory 503 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to embodiments of the present invention, other and further embodiments of the invention may be devised without departing from the basic scope thereof, and the scope thereof is determined by the claims that follow.

What is claimed is:

1. A computer-implemented method of implementing communication between a software side and a hardware side of a test bench executing on a workstation in a transaction-based acceleration verification system, comprising:
   identifying transactors and communication channels in a hierarchy of the test bench, where location of the software side of the hierarchy is different than location of the hardware side; and
   binding, automatically during verification using a computer, software side endpoints of the communication channels to hardware side endpoints of the communication channels by obtaining locations in the hierarchy for the software side endpoints and the hardware side endpoints based on naming attributes of the transactors and communication channels with respect to the software side and the hardware side of the test bench.

2. The method of claim 1, wherein the act of binding comprises:
   generating first unique identifiers for the software side endpoints in the software side and second unique identifiers for hardware side endpoints in the hardware side;
   associating the first unique identifiers with software side paths to the communication channels and the second unique identifiers with hardware side paths to the communication channels;
   matching the first unique identifiers with the second unique identifiers; and
   binding the software side endpoints and the hardware side endpoints using the software side paths and the hardware side paths corresponding to pairs of matching first and second unique identifiers.

3. The method of claim 2, wherein each of the first unique identifiers and the second unique identifiers is formed from a combination of a transactor definition name, a transactor occurrence name, a communication channel definition name, and a communication channel occurrence name.

4. The method of claim 3, wherein each of the first unique identifiers and the second unique identifiers is further formed from a vendor identifier.

5. The method of claim 1, wherein the act of identifying comprises:
   determining software side paths and hardware side paths in a hierarchy of the test bench for the transactors based on registration of the transactors.

6. The method of claim 5, wherein the act of identifying comprises:
   determining software side paths and hardware side paths in a hierarchy of the test bench for the communication channels based on registration of the communication channels.

7. The method of claim 1, further comprising:
   performing functional verification tests on a device under verification (DUV) using the test bench.

8. Apparatus for implementing communication between a software side and a hardware side of a test bench executing on a workstation in a transaction-based acceleration verification system, comprising:
   means for identifying transactors and communication channels in a hierarchy of the test bench, where location of the software side of the hierarchy is different than location of the hardware side; and
   means for binding, automatically during verification, software side endpoints of the communication channels to hardware side endpoints of the communication channels by obtaining locations in the hierarchy for the software side endpoints and the hardware side endpoints based on naming attributes of the transactors and communication channels with respect to the software side and the hardware side of the test bench.

9. The apparatus of claim 8, wherein the names for binding comprises:
   means for generating first unique identifiers for the software side endpoints in the software side and second unique identifiers for hardware side endpoints in the hardware side;
   means for associating the first unique identifiers with software side paths to the communication channels and the second unique identifiers with hardware side paths to the communication channels;
   means for matching the first unique identifiers with the second unique identifiers; and
   means for binding the software side endpoints and the hardware side endpoints using the software side paths and the hardware side paths corresponding to pairs of matching first and second unique identifiers.

10. The apparatus of claim 9, wherein each of the first unique identifiers and the second unique identifiers is formed from a combination of a transactor definition name, a transactor occurrence name, a communication channel definition name, and a communication channel occurrence name.

11. The apparatus of claim 10, wherein each of the first unique identifiers and the second unique identifiers is further formed from a vendor identifier.

12. The apparatus of claim 8, wherein the means for identifying comprises:
   means for determining software side paths and hardware side paths in a hierarchy of the test bench for the transactors based on registration of the transactors.

13. The apparatus of claim 12, wherein the means for identifying comprises:
   means for determining software side paths and hardware side paths in a hierarchy of the test bench for the communication channels based on registration of the communication channels.

14. The apparatus of claim 8, further comprising:
   means for performing functional verification tests on a device under verification (DUV) using the test bench.

15. A transaction-based acceleration verification system, comprising:
   a hardware accelerator configured to simulate a device under verification (DUV) and a hardware side of a test bench; and
   a workstation, coupled to the hardware accelerator, including:
      a simulator configured to simulate a software side of the test bench; and
      a binding infrastructure configured to identify transactors and communication channels in a hierarchy of the test bench, where location of the software side of the hierarchy is different than location of the hardware side, and bind, automatically during verification, software side endpoints of the communication channels to hardware side endpoints of the communication channels by obtaining locations in the hierarchy for the software side endpoints and the hardware side endpoints based on naming attributes of the transactors and communication channels with respect to the software side and the hardware side of the test bench.

16. The system of claim 15, wherein the binding infrastructure is configured to:
- generate first unique identifiers for the software side endpoints in the software side and second unique identifiers for hardware side endpoints in the hardware side;
- associate the first unique identifiers with software side paths to the communication channels and the second unique identifiers with hardware side paths to the communication channels;
- match the first unique identifiers with the second unique identifiers; and
- bind the software side endpoints and the hardware side endpoints using the software side paths and the hardware side paths corresponding to pairs of matching first and second unique identifiers.

17. The system of claim 16, wherein each of the first unique identifiers and the second unique identifiers is formed from a combination of a transactor definition name, a transactor occurrence name, a communication channel definition name, and a communication channel occurrence name.

18. The system of claim 17, wherein each of the first unique identifiers and the second unique identifiers is further formed from a vendor identifier.

19. The system of claim 15, wherein the workstation further includes a communication model configured to provide registration of the transactors, and wherein the binding infrastructure is configured to determine software side paths and hardware side paths in a hierarchy of the test bench for the transactors based on the registration of the transactors.

20. The system of claim 19, wherein the communication model is further configured to provide registration of the communication channels, and wherein the binding infrastructure is configured to determine software side paths and hardware side paths in a hierarchy of the test bench for the communication channels based on the registration of the communication channels.

* * * * *